(12) United States Patent
Drage et al.

(10) Patent No.: US 6,235,353 B1
(45) Date of Patent: May 22, 2001

(54) LOW DIELECTRIC CONSTANT FILMS WITH HIGH GLASS TRANSITION TEMPERATURES MADE BY ELECTRON BEAM CURING

(75) Inventors: James S. Drage, Fremont; Jingjun Yang, Cupertino, both of CA (US); Dong Kyu Choi, Kyoungki-Do (KR)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/245,060

(22) Filed: Feb. 5, 1999

Related U.S. Application Data (60) Provisional application No. 60/075,682, filed on Feb. 24, 1998.

(51) Int. Cl.$^7$ .................................. C08F 2/48; C08J 7/18
(52) U.S. Cl. .................. 427/493; 427/516; 427/517; 430/280.1; 430/281.1; 522/160; 522/162; 522/155; 522/178; 522/146; 522/149; 522/163; 522/165; 522/166; 522/904; 522/905; 525/125; 525/390
(58) Field of Search .................... 522/160, 162, 522/155, 178, 146, 149, 163, 165, 166, 904, 905; 525/390; 430/280.1, 281.1; 427/493

(56) References Cited

U.S. PATENT DOCUMENTS

| | | | | |
|---|---|---|---|---|
| 5,739,254 | * | 4/1998 | Fuller et al. .......................... | 528/125 |
| 5,939,206 | * | 8/1999 | Kneexel et al. ...................... | 428/480 |
| 5,986,045 | * | 11/1999 | Lau et al. ............................ | 528/401 |
| 5,994,425 | * | 11/1999 | Narang et al. ....................... | 522/35 |
| 6,020,119 | * | 2/2000 | Foucher et al. ...................... | 430/627 |

FOREIGN PATENT DOCUMENTS

WO 97/01594   6/1996   (WO) .

OTHER PUBLICATIONS

*MAT. RES. SOC. SYMP. PROC.*, vol. 476, pp. 121–128, 1997.

\* cited by examiner

*Primary Examiner*—James J. Seidleck
*Assistant Examiner*—Sanza L. McClendon (57) ABSTRACT

Production of a dielectric coating on a substrate whereby a poly(arylene ethers) or fluorinated poly(arylene ethers) layer is cured by exposure to electron beam radiation. A wide area electron beam is used which causes chemical reactions to occur in the polymer structure which are thought to cause crosslinks between polymer chains. The crosslinks lead to higher mechanical strength and higher glass transition temperature, lower thermal expansion coefficient, greater thermal-chemical stability and greater resistance to aggressive organic solvents. The polymer layer may also be optionally heated, thermally annealed, and/or exposed to UV actinic light.

28 Claims, 6 Drawing Sheets

LOW DIELECTRIC CONSTANT FILMS WITH HIGH GLASS TRANSITION TEMPERATURES MADE BY ELECTRON BEAM CURING

CROSS REFERENCE TO RELATED APPLICATION

This application claims the benefit of Provisional patent application Ser. No. 60/075,682 filed Feb. 24, 1998 which is incorporated herein by reference.

BACKGROUND OF THE INVENTION

1. Field of the Invention

This invention relates to low dielectric constant films useful in the production of integrated circuits.

2. Description of the Prior Art

Certain organic polymer dielectric films have important applications in integrated circuit (IC) fabrication. Such polymers are used as electrical insulating layers for multilevel interconnect structures in advanced IC devices. These materials are attractive because their dielectric constants are lower than that of the standard IC interconnect insulator, silicon dioxide (glass), which has a dielectric constant of about 4.0. It is well known that faster signal processing, lower power consumption, and reduced noise in circuitry results from use of selected organic polymers as the dielectric material, particularly with those which possess dielectric constants below 4.0, and especially those which have a dielectric constant below 3.0.

Production of interconnect structures in IC devices typically require the deposition of metal (usually aluminum or copper) to form wiring patterns that connect the circuit transistors. These deposition processes occur when the substrate is maintained at temperatures between about 350° C. and 500° C. Thus, the electrical insulating material must be chemically and mechanically stable at the metal deposition temperature.

Many organic polymer insulating films being considered for this application are chemically and mechanically unstable above 400° C. or even 350° C. Many such materials have glass transitions temperatures (Tg) below 400° C. or even below 300° C. When a polymer transcends from a glassy state to a rubbery state, it passes through the glass transition temperature or Tg. Polymers generally have less mechanical strength compared to aluminum or copper. Polymers also typically have a higher thermal expansion coefficient (TEC) compared to aluminum or copper. When a polymer transcends from the glassy state to the rubbery state, its mechanical strength or modulus decreases substantially. In this application, an IC interconnect structure would be made of aluminum or copper wiring patterns and polymer insulator layers. In view of the differences in TEC, a polymer would expand dimensionally to a greater extent than the wiring as the substrate temperature rises from room temperature to 350° C. and above. This mismatch in TEC causes large mechanical stresses to develop which may cause severe physical damage to the metal interconnect structure. Metal lines may break or become dislocated from their original positions. In addition to thermal-mechanical stability, the insulating layer must not thermally decompose at the same high processing temperatures; for example, thermal decomposition may lead to loss of mass through evolution of volatile fragments from the polymer.

Furthermore, the film must be impervious to photoresist processing steps. Such processes involve exposing the insulating layer to aggressive liquid chemicals for photoresist development and stripping. These solvents can either swell the polymer insulating layer or dissolve it off the substrate.

In standard processing of polymer insulating layers, the layer is cured at 400° C. or higher, typically between 400–500° C., for at least 30 minutes, but more typically 60 minutes. In this curing process the polymer undergoes chemical reactions, such as crosslinking, which render the material strong and glassy, and impervious to common organic solvents. These are desirable properties for a insulating layer. However, the time and temperature conditions needed to achieve these characteristics may cause damage to the aluminum or copper wiring. While aluminum or copper wiring may be safely exposed to 400–500° C. conditions for brief periods (up to 5 minutes as in metal deposition), the metal may be damaged if the time is as long as 30–60 minutes. This damage is characterized as stress-induced voiding, in which thermal mechanical stresses lead to thinning of the aluminum wires in localized areas. Thus, it is desirable to minimize the time required to complete the deposition and formation of insulating layers.

The present invention solves this problem by providing a method for curing polymer insulating layers for IC interconnect fabrication. The method for curing comprises exposure of the polymer layer to electron beam radiation. The electron beam tool is designed and used to expose all parts of the film to a uniform flux of electrons. This tool is also known as a wide area electron beam tool. The electron beam exposure causes chemical reactions to occur in the polymer structure which cause the formation of crosslinks between polymer chains. The crosslinks lead to higher mechanical strength and higher Tg, lower TEC, greater thermal-chemical stability, and greater resistance to aggressive organic solvents.

SUMMARY OF THE INVENTION

The present invention provides a process for forming a dielectric coating on a substrate which comprises:

a) forming a dielectric composition which comprises at least one polymer selected from the group consisting of poly(arylene ethers) and fluorinated poly(arylene ethers);

b) depositing the dielectric composition onto a substrate to thereby form a polymer layer;

c) optionally heating the polymer layer;

d) optionally exposing the polymer layer to actinic light;

e) exposing the polymer layer to electron beam radiation; and f) optionally thermally annealing the exposed polymer layer.

The invention also provides a process for forming a dielectric coating on a substrate which comprises:

a) forming a dielectric composition which comprises at least one polymer selected from the group consisting of poly(arylene ethers) and fluorinated poly(arylene ethers);

b) depositing the dielectric composition onto a substrate to thereby form a polymer layer;

c) heating the polymer layer;

d) exposing the polymer layer to light;

e) exposing the polymer layer to electron beam radiation; and f) thermally annealing the exposed polymer layer.

The invention further provides a process for forming a dielectric coating on a substrate which comprises:
   a) forming a dielectric composition which comprises at least one polymer selected from the group consisting of poly(arylene ethers) and fluorinated poly(arylene ethers);
   b) depositing the dielectric composition onto a substrate to thereby form a polymer layer; and
   c) exposing the polymer layer to electron beam radiation.

The invention still further provides a semiconductor device produced by a process which comprises:
   a) forming a dielectric composition which comprises at least one polymer selected from the group consisting of poly(arylene ethers) and fluorinated poly(arylene ethers);
   b) depositing the dielectric composition onto a substrate to thereby form a polymer layer;
   c) optionally heating the polymer layer;
   d) optionally exposing the polymer layer to actinic light;
   e) exposing the polymer layer to electron beam radiation; and
   f) optionally thermally annealing the exposed polymer layer.

The invention also provides a film or microelectronic structure produced by a process which comprises:
   a) depositing a dielectric composition onto a substrate, which dielectric composition comprises at least one polymer selected from the group consisting of poly (arylene ethers) and fluorinated poly(arylene ethers);
   b) optionally heating the polymer layer;
   c) optionally exposing the polymer layer to actinic light;
   d) exposing the polymer layer to electron beam radiation; and
   fe optionally thermally annealing the exposed polymer layer.

The invention further provides a process for forming a dielectric coating on a substrate which comprises:
   a) depositing an organic dielectric polymer composition onto a substrate to thereby form a polymer layer;
   b) optionally heating the polymer layer;
   c) optionally exposing the polymer layer to actinic light;
   d) exposing the polymer layer to electron beam radiation; and
   e) optionally thermally annealing the exposed polymer layer.

DETAILED DESCRIPTION OF THE PREFERRED EMBODIMENT

According to the invention, a dielectric coating is formed on a substrate. This coating comprises an organic dielectric polymer which preferably comprises one or more poly (arylene ethers) or fluorinated poly(arylene ethers). It is preferably formed with at least one suitable solvent to form a dielectric composition.

The dielectric composition may comprise a preformed poly(arylene ether) or fluorinated poly(arylene ether) polymer or pre-polymers in a monomeric state or oligomeric state may be formed on the substrate with subsequent polymerization. Suitable poly(arylene ethers) or fluorinated poly(arylene ethers) are known in the art from U.S. Pat. Nos. 5,155,175; 5,114,780 and 5,115,082. Preferred poly(arylene ethers) and fluorinated poly(arylene ethers) are disclosed in U.S. patent application Ser. No. 08/990,157 filed Dec. 12, 1997 which is incorporated herein by reference. Such poly (arylene ethers) have the structure:

wherein $Y_1$ is a first divalent arylene radical and $Y_2$ is a second divalent arylene radical, each divalent arylene radical selected from a first group consisting of:

and mixtures thereof, wherein when $Y_1$ and $Y_2$ are both selected to be:

then n=0.1 to 0.9 and m=1−n, else n=0 to 1 and m=1−n; $Ar_1$ is a third divalent arylene radical selected from the second group consisting of:

and Ar₂ is a fourth divalent arylene radical selected from the third group consisting of:

and mixtures thereof.

The polymer may be present in the dielectric composition in a pure or neat state (not mixed with any solvents) or it may be present in a solution where it is mixed with solvents. When solvents are present, the polymer is preferably present in an amount of from about 1% to about 50% by weight of the polymer, more preferably from about 3% to about 20% %. The solvent component is preferably present in an amount of from about 50% to about 99% by weight of the dielectric composition, more preferably from about 80% to about 97%. Suitable solvents nonexclusively include aprotic solvents such as cyclic ketones including cyclopentanone, cyclohexanone, cyclohexanone and cyclooctanone; cyclic amides such as N-alkylpyrrolidinone wherein the alkyl group has from 1 to about 4 carbon atoms, and N-cyclohexyl-pyrrolidinone, and mixtures thereof Once formed, the dielectric composition is deposited onto a suitable substrate to thereby form a polymer layer on the substrate. Deposition may be conducted via conventional spin-coating, dip coating, roller coating, spraying, chemical vapor deposition methods, or meniscus coating methods which are well-known in the art. Spin coating is most preferred. The thickness of the polymer layer on the substrate may vary depending on the deposition procedure and parameter setup, but typically the thickness may range from about 500 Å to about 50,000 Å, and preferably from about 2000 Å to about 12000 Å. The amount of dielectric composition applied to the substrate may vary from about 1 ml to about 10 ml, and preferably from about 2 ml to about 8 ml. In the preferred embodiment, the liquid dielectric composition is spun onto the upper surface the substrate according to known spin techniques. Preferably, the polymer layer is applied by centrally applying the liquid dielectric composition to the substrate and then spinning the substrate on a rotating wheel at speeds ranging from about 500 to about 6000 rpm, preferably from about 1500 to about 4000 rpm, for about 5 to about 60 seconds, preferably from about 10 to about 30 seconds, in order to spread the solution evenly across the substrate surface. The polymer layer preferably has a density of from about 1 g/cm³ to about 3 g/cm³.

Typical substrates include those suitable to be processed into an integrated circuit or other microelectronic device. Suitable substrates for the present invention non-exclusively include semiconductor materials such as gallium arsenide (GaAs), germanium, silicon, silicon germanium, and compositions containing silicon such as crystalline silicon, polysilicon, amorphous silicon, epitaxial silicon, and silicon dioxide ($SiO_2$) and mixtures thereof. Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

The polymer layer may optionally be heated to expel residual solvent or to increase its molecular weight. The heating may be conducted by conventional means such as heating on a hot plate in air or in an inert atmosphere, or it may occur in a furnace or oven in air, or in an inert atmosphere, or it may occur in a vacuum furnace or vacuum oven. Heating is preferably conducted at a temperature of from about 80° C. to about 500° C., and more preferably from about 150° C. to about 425° C. This heating is preferably performed from about 1 minute to about 360 minutes, and more preferably from about 2 to about 60 minutes. Optionally, one may choose to heat the polymer layer after the electron beam treatment. This heating after electron beam exposure can be conducted under the same conditions indicated as heating conducted prior to electron beam exposure. The purpose of post electron beam heating is to ensure that the polymer has undergone all potential thermal reactions at the highest temperature used in IC interconnect process steps that may occur later. Thus, if the highest temperature used in later IC interconnect process steps is 400° C., then the post electron beam treatment would be done at this temperature. Having a polymer layer which is stable to the highest used temperature greatly simplifies the fabrication of the interconnect structure.

The polymer layer may also optionally be exposed to actinic light, such as UV light, to increase its molecular weight. The amount of exposure may range from about 100 mJ/cm² to about 300 mJ/cm².

The electron beam exposure of the polymer layer may be performed either before or after the heating process. The polymer layer may be exposed to electron beams in any chamber having a means for providing electron beam radiation to substrates placed therein. Preferably, an electron beam chamber is used which provides an large area electron source. Suitable electron beam chambers are commercially available from Electron Vision, a unit of AlliedSignal Inc., under the trade name "ElectronCure™". The principles of operation and performance characteristics of such device are described in U.S. Pat. No. 5,001,178, the disclosure of which is expressly incorporated herein by reference. The temperature of the electron beam exposure preferably ranges from about 20° C. to about 450° C., more preferably from about 150 to about 400° C. The electron beam energy is preferably from about 1 to about 30 KeV, and more preferably from about 3 to about 10 KeV. The dose of electrons is preferably between about 500 to about 50,000 $\mu C/cm^2$ and more preferably from about 3,000 to about 20,000 $\mu C/cm^2$. The gas ambient in the electron beam tool can be any of the following gases: nitrogen, oxygen, hydrogen, argon, or xenon or any combination of these gases. The electron beam current is preferably from about 1 to about 40 mA, and more preferably from about 5 to about 20 mA. The end result of the electron beam treatment will be a polymer layer which has a Tg above about 350° C., and preferably above about 400° C., which has a dielectric constant below about 3.0, which is resistant to aggressive chemicals, and which shows good thermal and chemical stability.

As an optional step, the polymer layer may be thermally annealed before and/or after the electron beam treatment. This annealing process may be achieved by heating the substrate at a temperature in the range of about 200 to about 1050° C. over a period in the range of about 1 to about 360 minutes. The annealing process can be performed in an oven or tube furnace at atmospheric pressure. The annealing process may also be done in a vacuum. This thermal annealing causes a crosslinking and densification of the surface.

As a result of the present invention, a dielectric coating is formed having an advantageously low dielectric constant. Such coatings preferably have dielectric constants of from about 1 to about 3.5, more preferably from about 1.3 to about 3.0 and most preferably from about 1.5 to about 2.5. Additionally, they exhibit thermal stability permitting cure temperatures of about 425° C. or greater.

The following nonlimiting examples serve to illustrate the invention.

EXAMPLE 1

Thin films of poly(arylene ether) polymer having a molecular weight of 35,000 were formed on 4" silicon wafers using a conventional spin-coating technique. After spin-coating, the film was subjected to a hot-plate bake at a temperature of 150° C. for 2 min. The film thickness after the spinning and baking processes was in the range of 8000 to 10000 Å. Thermal curing was carried out at 425° C. for one hour in a horizontal furnace with $N_2$ flow at atmospheric pressure.

Electron beam exposure was conducted in an ElectronCure™ 30 chamber incorporating a large area electron source and quartz lamps for heating the wafer. The cold-cathode gas source produced a large area electron beam (over 200 mm in diameter) having a substantially uniform emission over its entire surface. Electron emission were be controlled by the low bias voltage applied to the anode grid. Two different e-beam exposure conditions, low and high doses (3 and 10 mC/cm²) at a fixed energy (8 KeV), were employed in the current experiment. The electron beam penetration depth at the electron energy of 8 KeV was about 1 $\mu$m. Thus, the entire film thickness was assumed to be irradiated by the electron beam. Electron beam exposure was conducted at a temperature of 200° C. and in an argon atmosphere (10–30 milliTorr). Table 1 shows the experimental metrics with respect to e-beam conditions and thermal treatment prior to e-beam exposure.

Room temperature stress measurements and stress-temperature cycling experiments were performed using a Tencor Flexus stress measurement system. Stress-temperature cycling experiments were conducted from room temperature to 500° C.; during the heating phase the temperature was raised 4° C. per minute; during the cooling phase the temperature decreased in an exponential fashion from 500° C. to room temperature over a period of 7 hours. The $T_g$ was derived from the curve of stress versus temperature. $T_g$ is the temperature at which the film stress no longer changes with increasing temperature.

Refractive index and thickness of films were measured using a Rudolph AutoEL III ellipsometer and Nanospec AFT, respectively. Dielectric constants were measured using MOS capacitor structures. The latter were fabricated by coating films of the poly(arylene ether) on 4 inch diameter Si wafers, followed by evaporative deposition of Al dots onto the films. C-V curves were measured using the MOS capacitors at 1 MHz. Dielectric constants were derived from capacitance values corresponding to the accumulation region of the C-V curve, the thickness of the films, and the capacitor (Al dot) areas. Solvent resistance was tested by measuring film thickness before and after immersing the films in N-methylpyrrolidone (NMP) at 90° C. for 1 hour.

TABLE 1

| Process Sequence | E-Beam Exposure Conditions | |
|---|---|---|
| | Energy (KeV) | Dose (mC/cm$^2$) |
| Bake/Thermal Cure only as Control (TC) | No | No |
| Bake/E-Beam Low Dose (EB-LD) | 8 | 3 |
| Bake/E-Beam High Dose (EB-HD) | 8 | 10 |
| Bake/Thermal Cure/E-Beam Low Dose (TC/EB-LD) | 8 | 3 |
| Bake/Thermal Cure/E-Beam High Dose (TC/EB-HD) | 8 | 10 |

Film Characterization

Refractive index, shrinkage and stress data obtained at room temperature for thermally-cured and e-beam cured films are summarized in Table 2. Compared to the thermal cure, the e-beam cure leads to a higher refractive index. Increasing the e-beam dose from 3 to 10 mC/cm$^2$ causes the refractive index to increase significantly compared to the thermal cure. Still higher refractive indices were found when films were first thermally cured and then e-beam cured. Shrinkage increases with increasing e-beam dose. And, as in the case of the refractive index, shrinkage was higher still when the thermal cure preceded the e-beam exposure. Film stress measured at room temperature was about the same for e-beam cured and thermally cured films. All the films were tensile stressed. The experimental error in the stress measurement was about +/−5 MPa. There was no apparent relation between stress and e-beam dose. It is interesting that the e-beam cured films underwent more shrinkage compared to the thermal cured films, but the stress levels in the e-beam and thermally cured films were about the same.

TABLE 2

| Process Conditions | Refractiv Index | Shrinkage (%) | Stress (MPa) at 20° C. |
|---|---|---|---|
| Bake/Thermal Cure only as Control (TC) | 1.67 | 3.0 | 42 |
| Bake/E-Beam Low Dose (EB-LD) | 1.77 | 5.7 | 40 |
| Bake/E-Beam High Dose (EB-HD) | 1.88 | 10.8 | 32 |
| Bake/Thermal Cure/E-Beam Low Dose (TC/EB-LD) | 1.78 | 6.1 | 31 |
| Bake/Thermal Cure/E-Beam High Dose (TC/EB-HD) | 1.95 | 16.8 | 43 |

Figure 1:
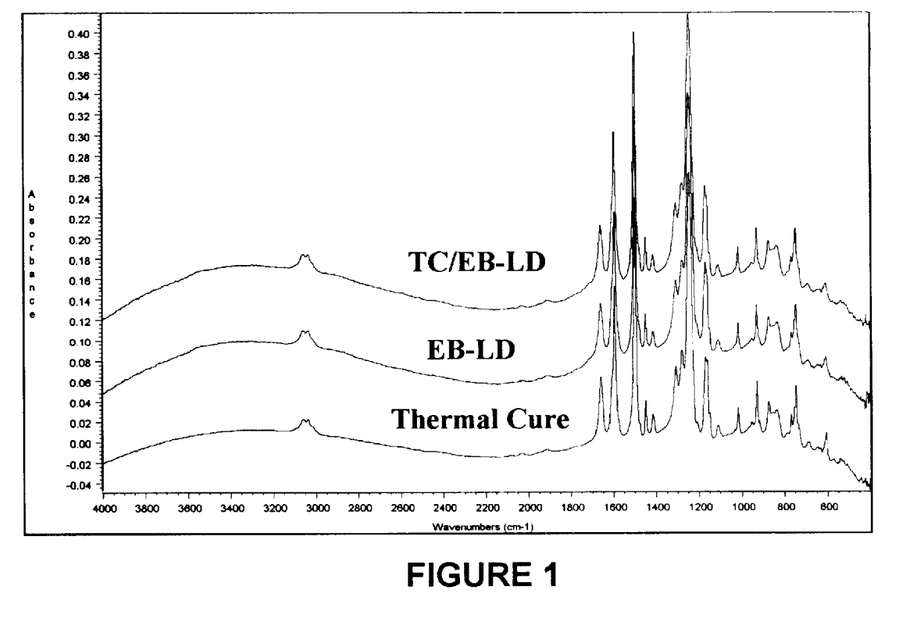
FIG. 1 shows FTIR spectra for thermally cured films in comparison to low dose electron beam cured poly(arylene) ether films.
Figure 2:
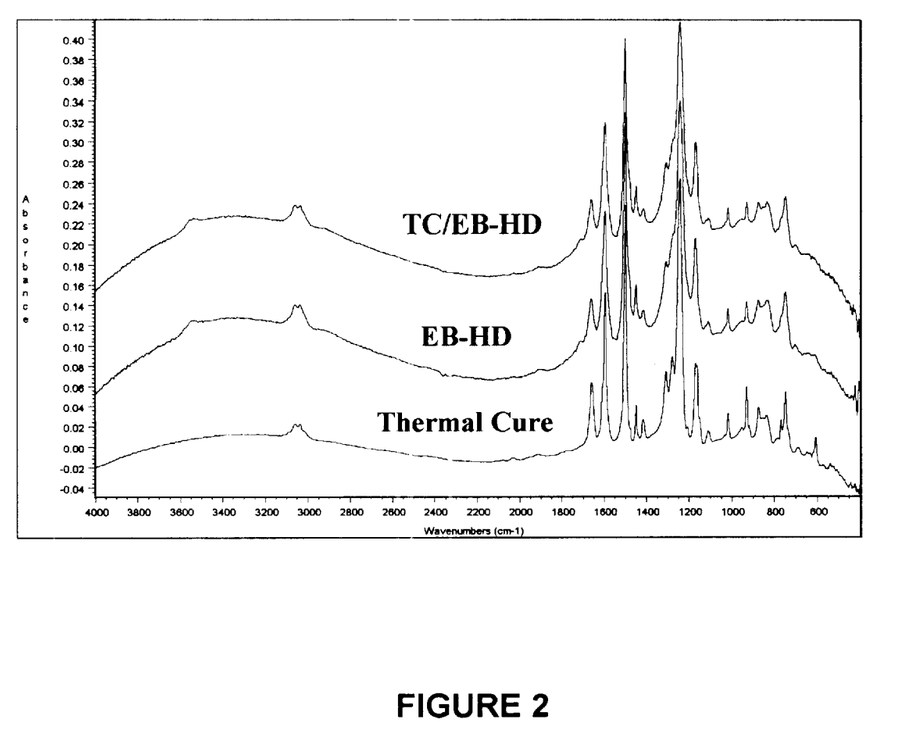
FIG. 2 shows FTIR spectra for thermally cured films in comparison to high dose electron beam cured poly(arylene) ether films.
Figure 3:
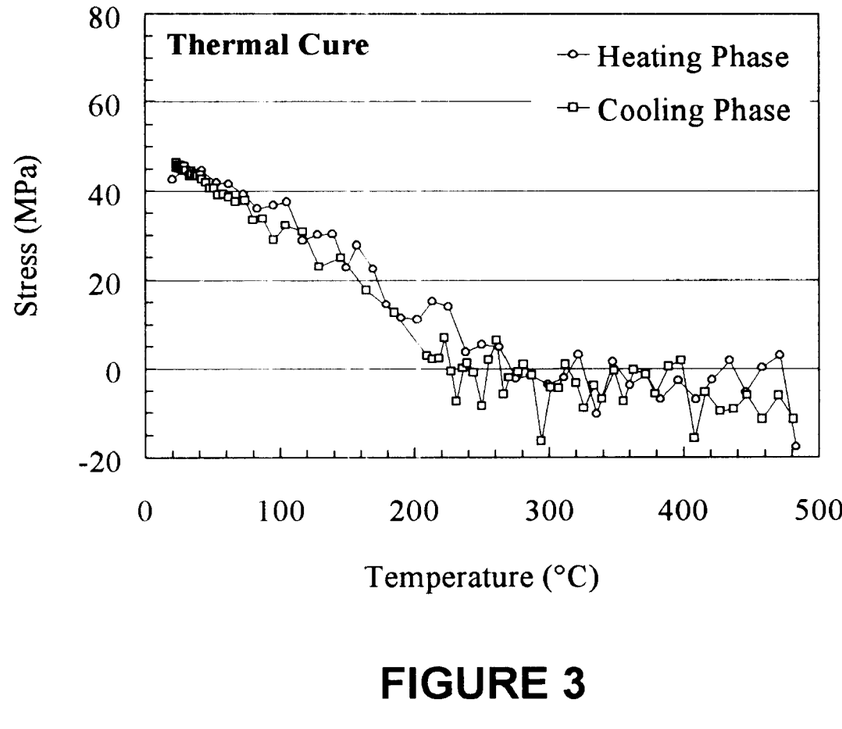
FIG. 3 shows stress as a function of temperature for thermally cured films according to the invention.
Figure 4:
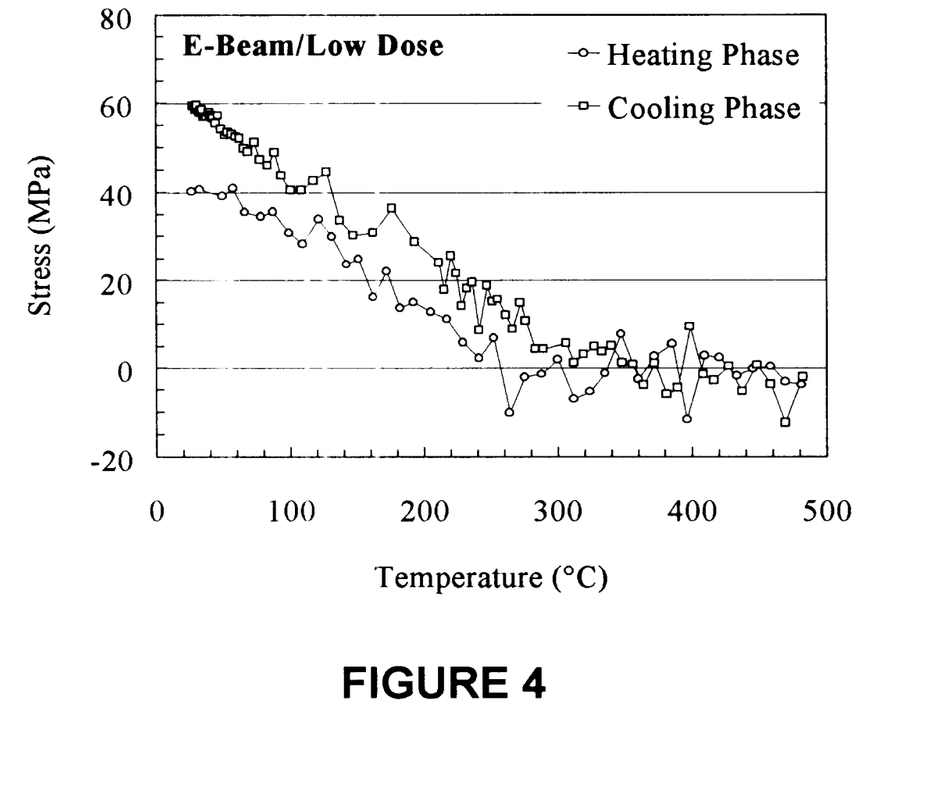
FIG. 4 shows stress as a function of temperature for low dose electron beam cured films according to the invention.
Figure 5:
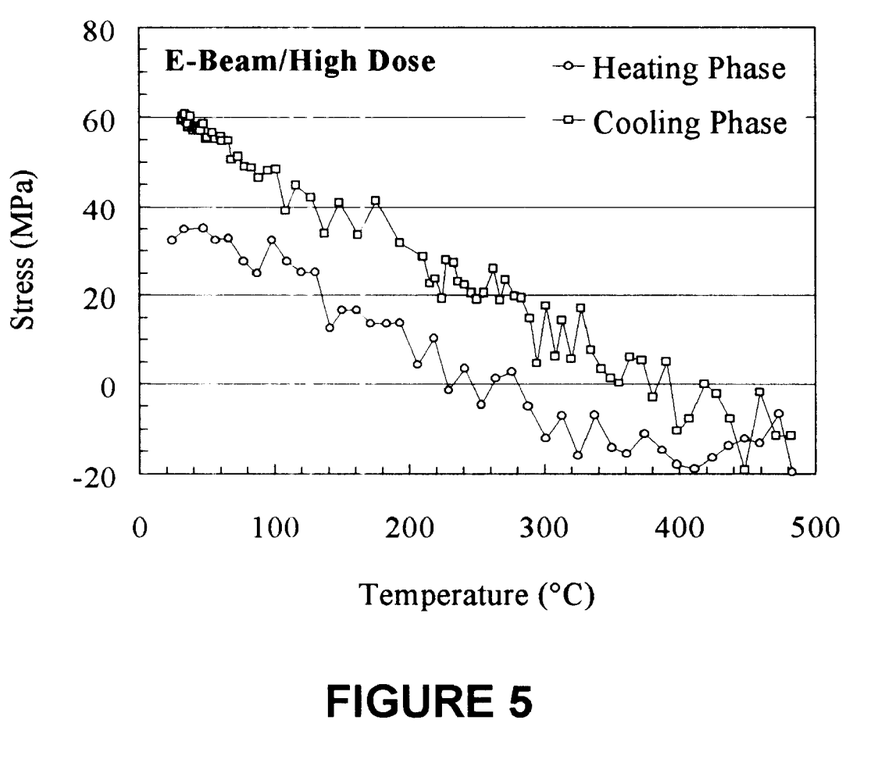
FIG. 5 shows stress as a function of temperature for high dose electron beam cured films according to the invention.

FIG. 1 shows FTIR spectra for e-beam cured poly(arylene ether) films in comparison with thermally-cured films. FIG. 1 shows that the thermally cured film, and the low dose e-beam cured films had identical FTIR spectra. Thus there were no chemical significant structure differences between e-beam and thermally cured films. The high dose e-beam cured films also exhibited similar FTIR spectra, as shown in FIG. 2, however the absorptions were slightly broader compared to the thermally-cured films. The high dose e-beam cured films also had a small broad absorption at 3500 cm$^{-1}$. This absorption suggests the presence of —OH groups in the polymer; however, the dielectric constant data (see below) do not support this explanation. The source of this absorption is still being investigated. The broader absorptions in the high dose e-beam cured films may have resulted from cross-linking reactions.

Solvent Resistance

Table 3 shows the thickness retention (%) for films after immersion in N-methylpyrrolidone (NMP) at 90° C. for one hour. A significant increase in the film thickness was found for the thermally-cured film, that is, the film swelled in the solvent. However, the thickness of e-beam cured films was unchanged irrespective of e-beam exposure conditions.

TABLE 3

| Process Conditions | Thickness Retention (%) |
|---|---|
| Bake/Thermal Cure only as Control (TC) | 117 |
| Bake/E-Beam Low Dose (EB-LD) | 100 |
| Bake/E-Beam High Dose (EB-HD) | 100 |
| Bake/Thermal Cure/E-Beam Low Dose (TC/EB-LD) | 100 |
| Bake/Thermal Cure/E-Beam High Dose (TC/EB-HD) | 100 |

Glass Transition Temperature

Figure 6:
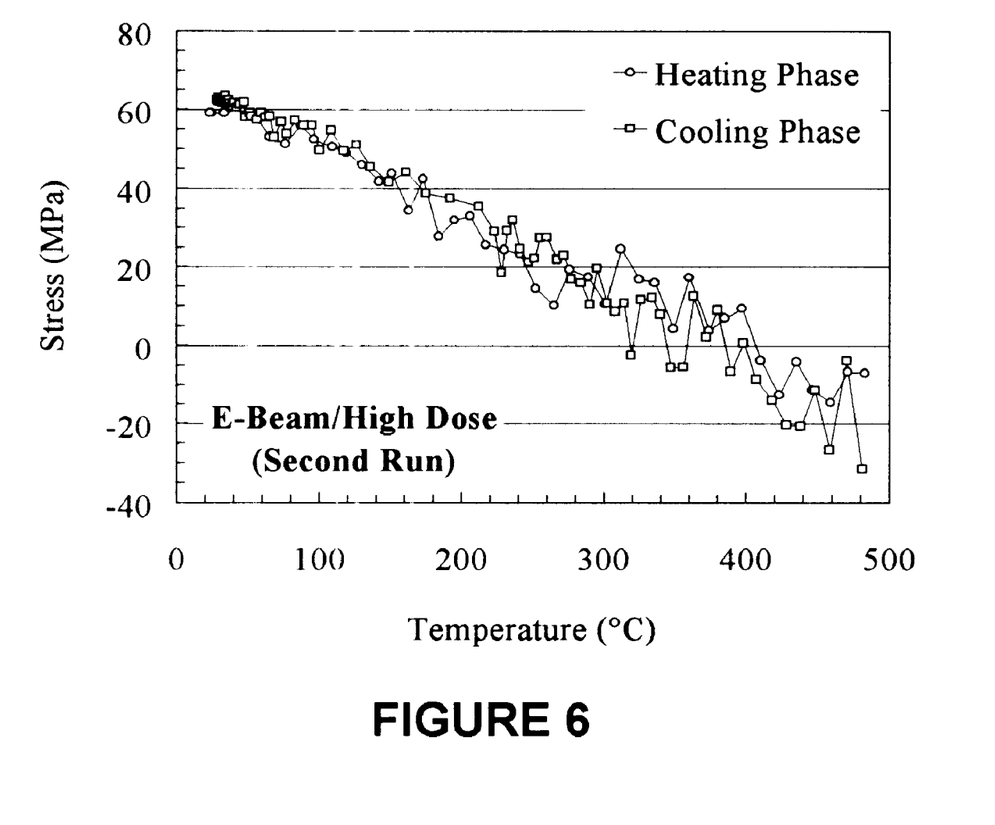
FIG. 6 shows stress as a function of temperature for high dose electron beam cured films according to the invention (2nd cycle).

FIGS. 3–6 show the results for the stress-temperature cycling tests performed on the films after thermal cure, e-beam cure at low dose and e-beam cure at high dose, respectively. Compared to the thermal cure, e-beam cure at low dose had little influence on the glass transition temperature. However, the e-beam cure at high dose enhanced the glass transition temperature beyond 400° C. In the tests done on e-beam cured films, irrespective of the e-beam dose, there was hysteresis in the first cycle, wherein the stress values are consistently higher in the cooling phase compared to the heating phase. The final stress at room temperature is 60 MPa, 500% higher than at the start of the test. FIG. 6 shows essentially no hysteresis occurred in the second cycle run on the high dose e-beam cured film. In this case the beginning and final stress is 60 MPa at room temperature. To help explain the hysteresis, it is worthwhile to consider that the e-beam exposures were done at 200° C., well below the maximum temperature of these tests. Additional cross linking reactions, or other structure changes, may be occurring above 200° C. in the first stress-temperature cycle. Then in the second cycle the film behaved as a fully annealed high $T_g$ material and there was no hysteresis.

Dielectric Constant

Dielectric constants were measured after the initial thermal cure, after the e-beam cures, and after a thermal cycling test between room temperature and 500° C. Table 4 lists the results. The dielectric constant was 2.8 for the thermally cured film, which is consistent with previous measurements on this material. The high dose e-beam cured film gave a dielectric constant of 2.7, which is not significantly different. The usual experimental error is about +/−0.2. In another set of experiments, dielectric constant was measured after thermal cycling between room temperature and 500° C. The dielectric constants for e-beam cured films were the same as those for the thermally-cured films, irrespective of the e-beam curing conditions.

TABLE 4

Dielectric Constants Measured using a MOS Capacitor Structure at 1 Mhz.

| Process Conditions | Dielectric Constants Measured After Thermal or E-beam Curing | Dielectric Constants Measured after Thermal Cycling Test |
|---|---|---|
| TC | 2.8 | 3.0 |
| EB-LD | NA | 2.9 |
| EB-HD | 2.7 | 3.0 |
| TC/EB-LD | NA | 2.8 |
| TC/EB-HD | NA | 2.6 |

The above results showed that e-beam curing, particularly with a high dose, enhanced properties such as solvent resistance and glass transition temperature for poly(arylene ether) films. Furthermore, e-beam curing did not raise the dielectric constant compared to the thermally-cured film. E-beam exposure did not significantly change the chemical structure of the poly(arylene ether) film as it does for the family of silicon-oxygen based polymer films such as siloxane polymers. The results suggest significant advantages of e-beam curing over conventional thermal curing for poly(arylene ether) dielectric coatings.

What is claimed is:

1. A process for forming a dielectric coating on a substrate which comprises:

a) forming a dielectric composition which comprises at least one polymer selected from the group consisting of poly(arylene ethers) and fluorinated poly(arylene ethers);

b) depositing the dielectric composition onto a substrate to thereby form a polymer layer;

c) optionally heating the polymer layer;

d) optionally exposing the polymer layer to actinic light;

e) exposing the polymer layer to electron beam radiation; and f) thermally annealing the exposed polymer layer.

2. The process of claim 1 wherein the polymer is a poly(arylene ether).

3. The process of claim 1 wherein the polymer is a fluorinated poly(arylene ether).

4. The process of claim 1 wherein the poly(arylene ether) has the structure:

wherein $Y_1$ is a first divalent arylene radical and $Y_2$ is a second divalent arylene radical, each divalent arylene radical selected from a first group consisting of:

,

-continued and mixtures thereof, wherein when $Y_1$ and $Y_2$ are both selected to be:

then n=0.1 to 0.9 and m=1−n, else n=0 to 1 and m=1−n; $Ar_1$ is a third divalent arylene radical selected from the second group consisting of:

and $Ar_2$ is a fourth divalent arylene radical selected from the third group consisting of:

and mixtures thereof.

5. The process of claim 1 wherein the dielectric composition is spin deposited onto the substrate.

6. The process of claim 1 wherein step (c) is conducted.

7. The process of claim 6 wherein the polymer layer is heated before exposure to electron beam radiation.

8. The process of claim 1 wherein step (d) is conducted.

9. The process of claim 8 wherein the polymer layer is exposed to UV light under conditions sufficient to increase the molecular weight of the polymer.

10. The process of claim 8 wherein the polymer layer is exposed from about 100 mJ/cm$^2$ to about 300 mJ/cm$^2$.

11. The process of claim 1 wherein the electron beam exposure is conducted at a vacuum in the range of from about $10^{-5}$ to about $10^2$ torr, and at a temperature in the range of from about 20° C. to about 450° C.

12. The process of claim 1 wherein the electron beam exposing is conducted at an energy level ranging from about 1 to about 30 KeV.

13. The process of claim 1 wherein the electron beam exposing is conducted at an electron dose ranging from about 500 to about 50,000 $\mu C/cm^2$.

14. The process of claim 1 wherein the electron beam exposing is conducted with a wide, large beam of electron beam radiation from a uniform large-area electron beam source.

15. The process of 1 wherein the electron beam exposing is conducted with a wide, large beam of electron beam radiation from a uniform large-area electron beam source which covers an area of from about 4 square inches to about 256 square inches.

16. The process of claim 1 wherein the thermal annealing is conducted by heating the substrate at a temperature in the range of about 80 to about 500° C. over a period of from about 1 to about 360 minutes.

17. The process of claim 1 wherein the substrate comprises silicon, germanium, silicon germanium or gallium arsenide.

18. The process of claim 1 wherein the substrate comprises at least one semiconductor material.

19. The process of claim 18 wherein the substrate comprises at least one semiconductor material selected from the group consisting of gallium arsenide, silicon, and compositions containing silicon such as crystalline silicon, polysilicon, amorphous silicon, epitaxial silicon, and silicon dioxide, and mixtures thereof.

20. The process of claim 18 wherein the substrate has a pattern of lines on its surface.

21. The process of claim 20 wherein the lines comprise a metal, an oxide, a nitride or an oxynitride.

22. The coated substrate produced according to the process of claim 1.

23. A process for forming a dielectric coating on a substrate which comprises:
   a) forming a dielectric composition which comprises at least one polymer selected from the group consisting of poly(arylene ethers) and fluorinated poly(arylene ethers);
   b) depositing the dielectric composition onto a substrate to thereby form a polymer layer;
   c) heating the polymer layer;
   d) exposing the polymer layer to actinic light;
   e) exposing the polymer layer to electron beam radiation; and
   f) thermally annealing the exposed polymer layer.

24. A process for forming a dielectric coating oil a substrate which comprises:
   a) forming a dielectric composition which comprises at least one polymer selected from the group consisting of poly(arylene ethers) and fluorinated poly(arylene ethers);
   b) depositing the dielectric composition onto a substrate to thereby form a polymer layer; and
   c) exposing the polymer layer to electron beam radiation; and
   d) thermally annealing the exposed polymer layer.

25. A semiconductor device produced by a process which comprises:
   a) forming a dielectric composition which comprises at least one polymer selected from the group consisting of poly(arylene ethers) and fluorinated poly(arylene ethers);

b) depositing the dielectric composition onto a substrate to thereby form a polymer layer;

c) optionally heating the polymer layer;

d) optionally exposing the polymer layer to actinic light;

e) exposing the polymer layer to electron beam radiation; and f) thermally annealing the exposed polymer layer.

26. A film produced by a process which comprises:

a) depositing a dielectric composition onto a substrate, which dielectric composition comprises at least one polymer selected from the group consisting of poly(arylene ethers) and fluorinated poly(arylene ethers) to thereby form a polymer layer;

b) optionally heating the polymer layer;

c) optionally exposing the polymer layer to actinic light;

d) exposing the polymer layer to electron beam radiation; and f) thermally annealing the exposed polymer layer.

27. A microelectronic structure produced by a process which comprises:

a) depositing a dielectric composition onto a substrate, which dielectric composition comprises at least one polymer selected from the group consisting of poly(arylene ethers) and fluorinated poly(arylene ethers) to thereby form a polymer layer;

b) optionally heating the polymer layer;

c) optionally exposing the polymer layer to actinic light;

d) exposing the polymer layer to electron beam radiation; and e) thermally annealing the exposed polymer layer.

28. A process for forming a dielectric coating on a substrate which comprises:

a) depositing an organic dielectric polymer composition onto a substrate to thereby form a polymer layer;

b) optionally heating the polymer layer;

c) optionally exposing the polymer layer to actinic light;

d) exposing the polymer layer to electron beam radiation; and e) thermally annealing the exposed polymer layer.

* * * * *